(12) United States Patent
Seo et al.

(10) Patent No.: US 7,902,652 B2
(45) Date of Patent: Mar. 8, 2011

(54) SEMICONDUCTOR PACKAGE AND SEMICONDUCTOR SYSTEM IN PACKAGE USING THE SAME

(75) Inventors: Ho-Seong Seo, Suwon-si (KR); Shi-Yun Cho, Anyang-si (KR); Young-Min Lee, Yongin-si (KR); Sang-Hyun Kim, Yongin-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 265 days.

(21) Appl. No.: 11/894,338

(22) Filed: Aug. 21, 2007

(65) Prior Publication Data

US 2008/0073771 A1 Mar. 27, 2008

(30) Foreign Application Priority Data

Sep. 26, 2006 (KR) .................. 10-2006-0093433

(51) Int. Cl.
*H01L 23/02* (2006.01)
(52) U.S. Cl. .. 257/686; 257/685; 257/690; 257/E23.001; 438/106; 438/127
(58) Field of Classification Search .................. 257/775, 257/777, 678, 686; 438/257
See application file for complete search history.

(56) References Cited

U.S. PATENT DOCUMENTS 5,357,674 A * 10/1994 Lumbard .................. 29/843
2001/0038151 A1* 11/2001 Takahashi et al. ............ 257/778

FOREIGN PATENT DOCUMENTS

| JP | 2004-172157 | 6/2004 |
|---|---|---|
| KR | 2004-37561 | 5/2004 |
| KR | 2005-71825 | 7/2005 |
| KR | 2006-44288 | 5/2006 |

* cited by examiner

*Primary Examiner* — Thanh V Pham
*Assistant Examiner* — Mark A Laurenzi, III
(74) *Attorney, Agent, or Firm* — Cha & Reiter, LLC

(57) ABSTRACT

Disclosed are a semiconductor package and semiconductor system in package using the same. The semiconductor package includes: a printed circuit board (PCB); a semiconductor die disposed on the PCB and having conductive posts formed on an upper surface of the semiconductor die; and a molding formed on the PCB to cover the semiconductor die, wherein the conductive posts have a surface exposed out of an upper surface of the molding. The semiconductor system in package includes: a first semiconductor package having a semiconductor die on which conductive posts are formed, and a molding formed so that upper surfaces of the conductive posts are exposed; and a second semiconductor package disposed on the first semiconductor package and electrically connected to the conductive posts.

3 Claims, 4 Drawing Sheets

SEMICONDUCTOR PACKAGE AND SEMICONDUCTOR SYSTEM IN PACKAGE USING THE SAME

CLAIM OF PRIORITY

This application claims priority to an application entitled "Semiconductor Package and Semiconductor System In Package Using the Same," filed in the Korean Intellectual Property Office on Sep. 26, 2006 and assigned Serial No. 2006-93433, the contents of which are hereby incorporated by reference.

BACKGROUND OF THE INVENTION

1. Field of the Invention

The present invention relates to a semiconductor package that has a semiconductor die mounted thereon, and more particularly to a system in package (SIP) in which semiconductor packages are electrically connected to each other.

2. Description of the Related Art

A System In Package (SIP) refers to a package for modulating large scale integrated circuits such as a semiconductor die, which is applied to portable terminals which have difficulty in securing a mounting space. Recently, the SIP has been applied to various fields.

The SIP may be classified into a wire bonding-type SIP, a package on package-type SIP, a via-type SIP, and an embedded-type SIP. In the wire bonding-type SIP, semiconductor dies are laminated and connected to one another by wire-bonding. In the package on package-type SIP, thin packages are laminated. In the via-type SIP, a via hole penetrates through a silicone chip. In the embedded-type SIP, a chip size package of a wafer level is embedded in a resin substrate.

The SIP described above are used for configuring semiconductor dies functioning as memories and semiconductor dies functioning as logic circuits, or used for constituting semiconductor dies functioning as only memories and the combination of memories such as Micon. Recently, the SIP has been used for semiconductor die having various functions.

FIG. 1 is a sectional view showing the configuration of the conventional package-on-package-type SIP. Referring to FIG. 1, the conventional SIP 100 has the first and second semiconductor packages 110 and 120. The first and second semiconductor packages 110 and 120 are laminated in bi-level and connected to each other by means of a plurality of solder balls interposed between the first and second semiconductor packages 110 and 120.

The first and second semiconductor packages 110 and 120 include multilayered printed circuit boards (PCBs) 111 and 121, semiconductor dies 112 and 122 arranged on the PCBs 111 and 121, wires 114 and 124 for electrically connecting the semiconductor dies 112 and 122 to the PCBs 111 and 121, and moldings 113 and 123 formed on the PCBs 111 and 121 to cover the semiconductor dies 112 and 122.

Each of the PCBs 111 and 121 has electric patterns formed on an upper surface thereof, and each of the semiconductor dies 112 and 122 and a part of the electric patterns is electrically connected to each other by wire-bonding. Another part of the electric patterns, which is not connected to the semiconductor dies 112 and 112 by wire-bonding, is electrically connected to a corresponding package 110 or 120 by the solder balls 130.

One disadvantage of the conventional package-on-package-type SIP is that the conventional package-on-package-type SIP requires much space for solder balls, which are inserted between the first and second semiconductor packages, as the present application of the SIP requires much electrical connections between the first and second semiconductor packages. In addition, reliability and mechanical strength of the conventional SIP is low as the conventional SIP has small contact areas compared to the size of each package.

SUMMARY OF THE INVENTION

Accordingly, the present invention has been made to solve the problems occurring in the prior art and provide additional advantages, by providing a SIP with reduced volume.

In accordance to the first aspect of the present invention, there is provided a semiconductor package, which includes a printed circuit board (PCB); a semiconductor die disposed on the PCB and having conductive posts formed on an upper surface of the semiconductor die; and a molding formed on the PCB to cover the semiconductor die, wherein the conductive posts have a surface exposed out of an upper surface of the molding.

In accordance to the second aspect of the present invention, there is provided a semiconductor system in package, which includes a first semiconductor package having a semiconductor die on which conductive posts are formed, and a molding formed so that upper surfaces of the conductive posts are exposed; and a second semiconductor package disposed on the first semiconductor package and electrically connected to the conductive posts.

BRIEF DESCRIPTION OF THE DRAWINGS

The features and advantages of the present invention will be more apparent from the following detailed description taken in conjunction with the accompanying drawings, in which.

DETAILED DESCRIPTION OF THE INVENTION

Hereinafter, several aspects of the present invention will be described in detail with reference to the accompanying drawings. For the purposes of clarity and simplicity, a detailed description of known functions and configurations is omitted as they may make the subject matter of the present invention unclear.

Figure 1:
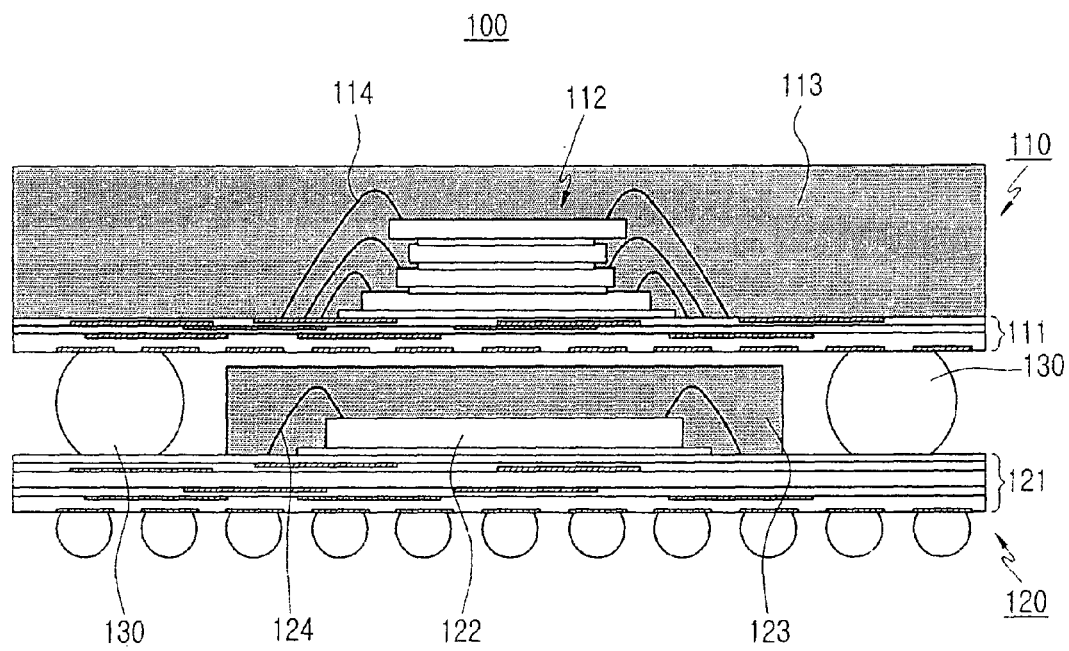
FIG. 1 is a sectional view showing the conventional Semiconductor In Package (SIP) integrated by package-on-package method.
Figure 2A:
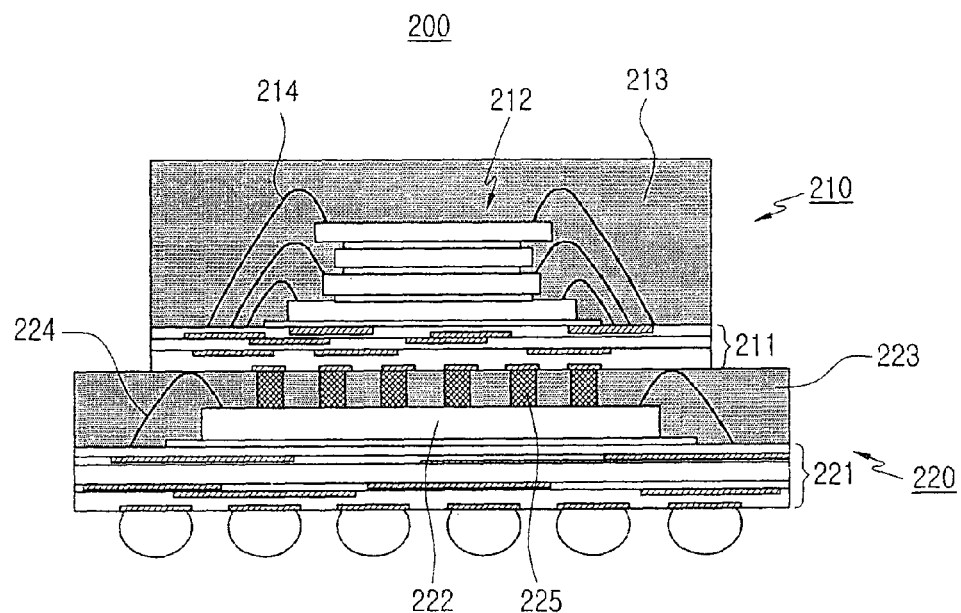
FIG. 2A is a sectional view showing a SIP according to the first aspect of the present invention.

FIG. 2A is a sectional view showing a SIP according to the first aspect of the present invention, whereas FIGS. 3A to 3D are sectional views showing the manufacturing step of the SIP shown in FIG. 2A. Referring to FIGS. 2A, 2B, and 3A to 3D, a SIP 200 according to the first aspect includes first and second semiconductor packages 220 and 210. The second semiconductor package 210 is disposed on the first semiconductor package 220.

The first semiconductor package 220 includes a semiconductor die 222, on which wiring redistributions 225 are formed; a molding 223 with exposed upper surface, the molding 223 through which the wiring redistributions 225 extend; and a printed circuit board (PCB) 221, on which the semiconductor die 222 is disposed. The molding 223 is formed on the PCB 221 covering the semiconductor die 222. The semiconductor die 222 is connected to the PCB 221 by wire-bonding.

Figure 2B:
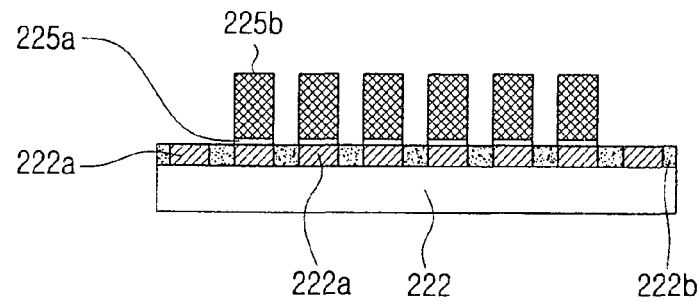
FIG. 2B a sectional view showing a semiconductor die shown in FIG. 2A.
Figure 3A:
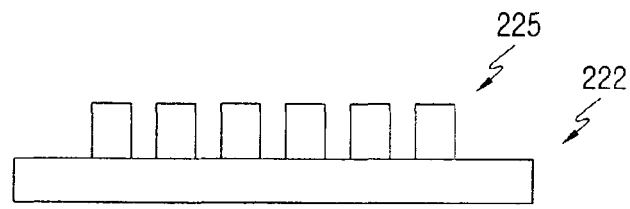
FIGS. 3A to 3D are sectional views showing the SIP shown in FIG. 2A in each manufacturing step.

FIG. 2B is a sectional view showing a semiconductor die mounted on the first semiconductor package 220 shown in FIG. 2A. FIG. 3A is a sectional view showing the semiconductor die 222. Referring to FIGS. 2B and 3A, the semiconductor die 222 has upper and lower surfaces which are opposite to each other. The lower surface of the semiconductor die 222 is disposed on, and makes contact with, the PCB 221.

The semiconductor die 222 includes bonding pads and circuit patterns 222a and an insulation layer 222b, both formed on the upper surface so that upper surfaces of the bonding pads and circuit patterns 222a are exposed. The wiring redistribution 225 includes bump-pads 225a, which are formed on some of the bonding pads and circuit patterns 222a exposed on the insulation layer 222b, and conductive posts 225b formed on the bump-pads 225a.

The semiconductor die 222 has circuit patterns on the upper surface, and the bonding pads and circuit pattern 222a are formed on an upper surface of a terminal, the terminal which is electrically connected to an exterior. The insulation layer 222b is formed on the semiconductor die 222, and covers the lateral surface of the bonding pads 222a. The upper surfaces of the bonding pads and circuit patterns 222a are exposed.

The bump-pads 225a are formed on the upper surfaces of bonding pads and circuit patterns 222a that are not connected to the PCB by wire-bonding. The conductive posts 225b, coupled to the bump-pad 225a by a process such as a reflow process, may be of a metallic material such as a copper.

Figure 3B:
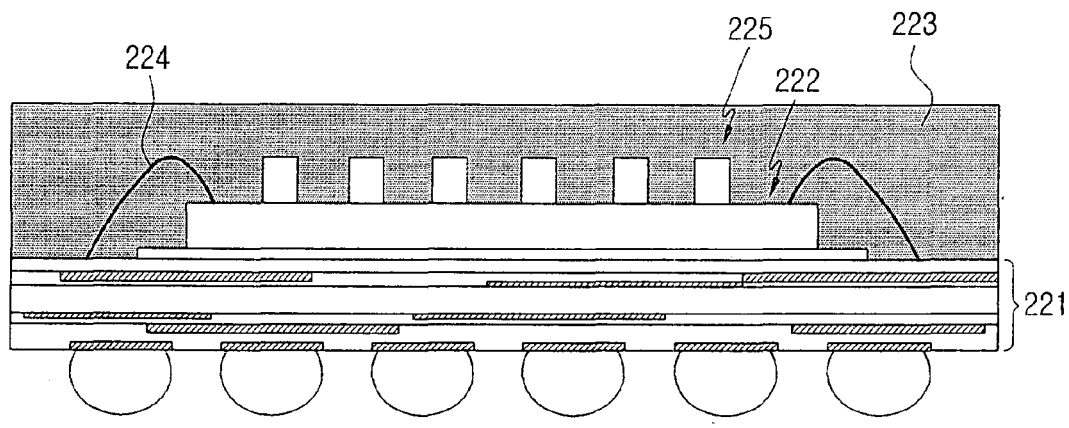
Figure 3C:
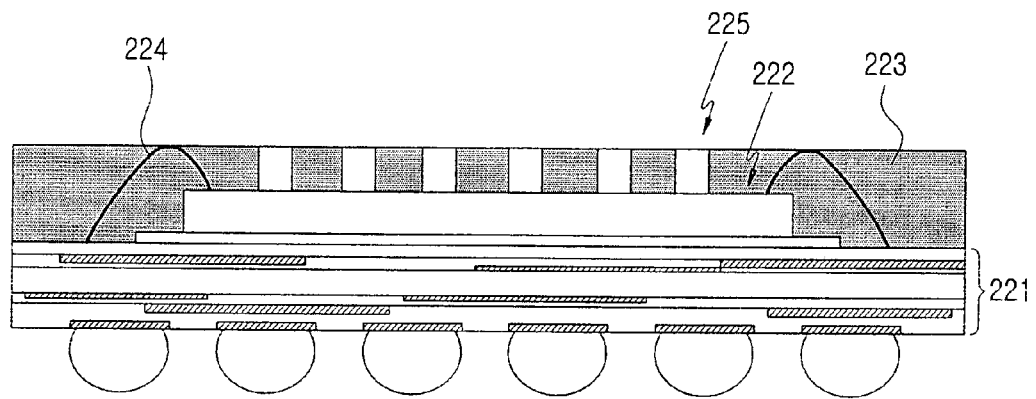

The molding 223 is formed on the PCB 221, and the molding 223 covers the semiconductor die 222. The molding 223 is formed to completely cover the semiconductor die 222 including the conductive posts 225b as shown in FIG. 3B. As shown in FIG. 3C, the upper surface of the molding 223 is partially etched or grounded so that the upper surfaces of the conductive posts 225b are exposed.

The second semiconductor package 210 includes PCB 211 that is disposed on the first semiconductor package 220 in a package-on-package manner, and at least one semiconductor die 212 arranged on the PCB 211. The semiconductor dies 212 are laminated on, and electrically connected, to the PCB 211 of the second semiconductor package 210. A molding is formed on the PCB 211.

Laminate type PCBs may be used as the PCBs 221 and 211 of the first and second semiconductor packages 220 and 210, and the PCB 211 of the second semiconductor package 210 is electrically connected to the conductive posts 225b exposed from the molding of the first semiconductor package 220.

Figure 3D:
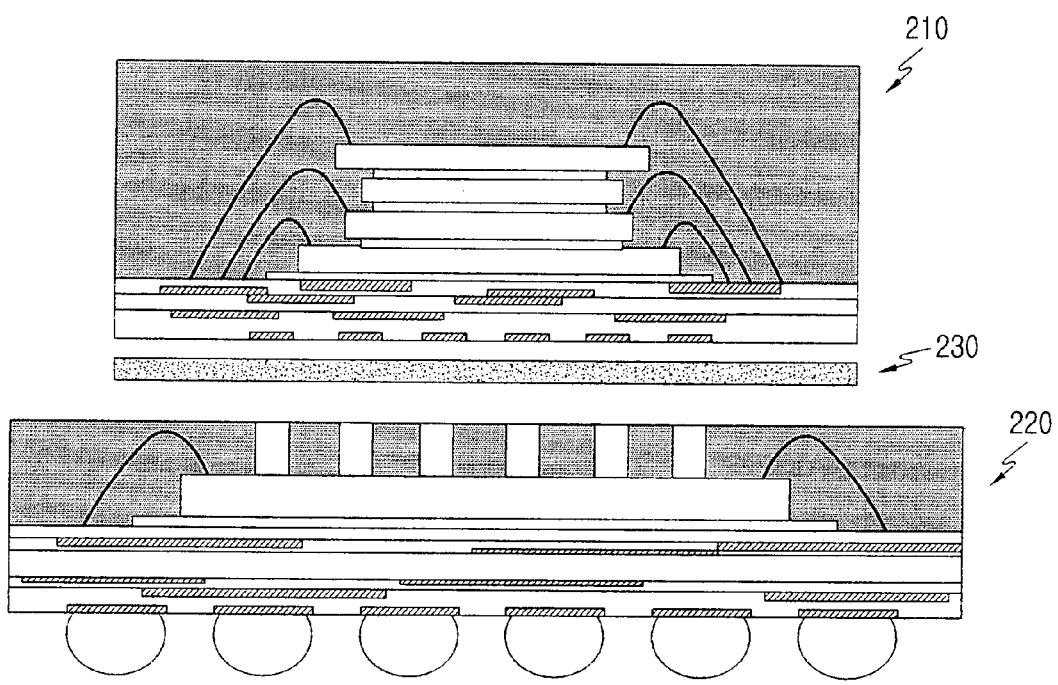

A conductive bonding pad 230 may be interposed between the first and second semiconductor packages 220 and 210, as shown in FIG. 3D. In addition, the first and second semiconductor packages 220 and 210 may be electrically connected to one another by the conductive bonding pad 230. The conductive bonding pad 230 may have particles of conductive, bonding materials, such as a metal. The conductive bonding pad 230 may be electrically connected to the first and second semiconductor packages 220 and 210 by pressure applied between the packages 2210 and 210, in upward, downward, and perpendicular directions.

Figure 4:
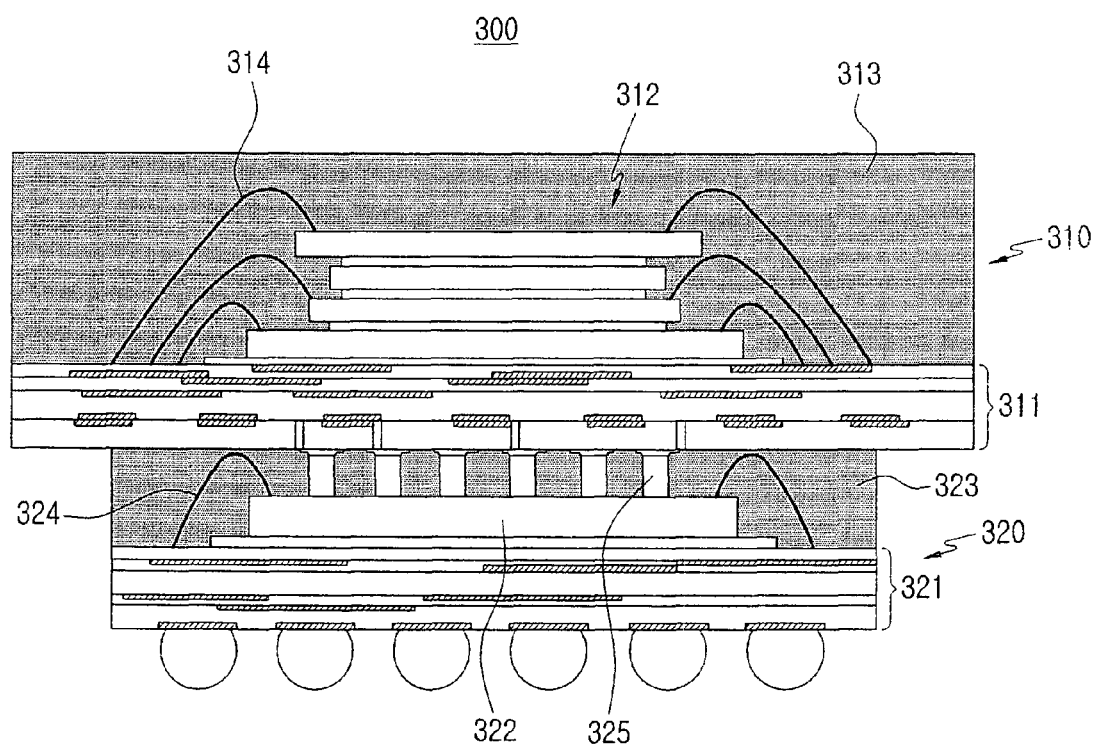
FIG. 4 is a sectional view of a SIP according to the second aspect of the present invention.

FIG. 4 is a sectional view showing a SIP 300 according to the second aspect of the present invention. Referring to FIG. 4, the SIP 300 of the second aspect includes the first and second semiconductor packages 320 and 310. The second semiconductor package 310 is disposed on the first semiconductor package 320. In addition, the second semiconductor package 310, which is longer than the first semiconductor package 320, is applied to the semiconductor SIP 300.

The first and second semiconductor packages 320 and 310 include PCBs 321 and 311; semiconductor dies 322 and 312 arranged on the PCBs 321 and 311, respectively; and moldings 323 and 313 formed to cover the corresponding PCBs 321 and 311 and the semiconductor dies 322 and 312. The semiconductor dies 322 and 312 can be electrically connected to the corresponding PCBs 321 and 311 by wire-bonding 324 and 314.

The semiconductor die 322 of the first semiconductor package 320 has conductive posts 325 formed on an upper surface. The semiconductor die 322 of the first semiconductor package 320 and the second semiconductor package 310 may be electrically connected to each other by the conductive posts 325. The first and second semiconductor packages 320 and 310 are connected to each other by an interposer interposed between them.

According to the present invention, a laminate-type semiconductor package has large scale integration when compared to the conventional package-on-package-type semiconductor package. Moreover, in the present invention stable mechanical strength and reliability of the semiconductor package with ease, as the contact area between the semiconductor packages increases While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor system in package (SIP), comprising:
    a first semiconductor package including a first printed circuit board (PCB), a first semiconductor die being disposed on the first PCB and having conductive posts disposed on an upper surface of the first semiconductor die, and a first molding disposed on the first PCB and being configured to cover the first semiconductor die and the conductive posts, wherein upper surfaces of the conductive posts are exposed out of the first molding; and
    a second semiconductor package including a second PCB, a second semiconductor die being disposed on the second PCB, and a second molding disposed on the second PCB and being configured to cover the second semiconductor die;
    wherein a second PCB is directly disposed on both of an upper surface of the first molding and the upper surfaces of the conductive posts;

wherein the first and second semiconductor packages are electrically connected to each other through the conductive posts without solder balls therebetween.

2. The semiconductor system in package as claimed in claim 1, wherein the first semiconductor die comprises:
bonding pads being disposed on the upper surface of the first semiconductor die;
an insulation layer being on the upper surfade of the first semiconductor die in such a manner that the bonding pads are exposed out of the insulation layer; and
bump-pads formed on the bonding pads exposed out of the insulation layer;
wherein the conductive posts are formed on the bump-pads.

3. The semiconductor system in package as claimed in claim 1, wherein the first and second semiconductor packages are electrically connected to each other only through the conductive posts.

* * * * *